(12) United States Patent
Ohno et al.

(10) Patent No.: US 11,935,822 B2
(45) Date of Patent: Mar. 19, 2024

(54) WIRING SUBSTRATE HAVING METAL POST OFFSET FROM CONDUCTOR PAD AND METHOD FOR MANUFACTURING WIRING SUBSTRATE

(71) Applicant: IBIDEN CO., LTD., Gifu (JP)

(72) Inventors: Isao Ohno, Ogaki (JP); Tomoya Daizo, Ogaki (JP); Yoji Sawada, Ogaki (JP); Kazuhiko Kuranobu, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 84 days.

(21) Appl. No.: 17/359,887

(22) Filed: Jun. 28, 2021

(65) Prior Publication Data
US 2022/0013448 A1    Jan. 13, 2022

(30) Foreign Application Priority Data

Jul. 9, 2020    (JP) ................... 2020-118811

(51) Int. Cl.
*H01L 23/498*    (2006.01)
*H01L 21/48*    (2006.01)
*H01L 23/00*    (2006.01)

(52) U.S. Cl.
CPC .... *H01L 23/49838* (2013.01); *H01L 21/4857* (2013.01); *H01L 23/49822* (2013.01); *H01L 24/10* (2013.01); *H01L 24/12* (2013.01); *H01L 24/13* (2013.01); *H01L 24/14* (2013.01)

(58) Field of Classification Search
CPC ... H01L 23/49838; H01L 24/10; H01L 24/12; H01L 24/13; H01L 24/14; H01L 2224/023
See application file for complete search history.

(56) References Cited

U.S. PATENT DOCUMENTS

| | | | |
|---|---|---|---|
| 2010/0243305 A1* | 9/2010 | Niki | C25D 7/123 |
| | | | 427/510 |
| 2015/0250054 A1* | 9/2015 | Yoshikawa | H01L 25/105 |
| | | | 361/767 |
| 2019/0131253 A1* | 5/2019 | Lee | H01L 24/19 |
| 2020/0075496 A1* | 3/2020 | Yu | H01L 24/32 |
| 2021/0125885 A1* | 4/2021 | Chen | H01L 23/5389 |
| 2021/0159197 A1* | 5/2021 | Huang | H01L 24/11 |

FOREIGN PATENT DOCUMENTS

JP    2016-018806 A    2/2016

* cited by examiner

*Primary Examiner* — Michael Jung
(74) *Attorney, Agent, or Firm* — Oblon, McClelland, Maier & Neustadt, L.L.P.

(57) ABSTRACT

A wiring substrate includes a resin insulating layer, a via conductor formed in the resin insulating layer such that the via conductor is penetrating through the resin insulating layer, a conductor pad formed on the resin insulating layer and connected to the via conductor, a coating insulating layer formed on the resin insulating layer such that the coating insulating layer is covering the conductor pad, and a metal post formed on the conductor pad and protruding from the coating insulating layer. The conductor pad is formed such that a central axis of the conductor pad is shifted in a predetermined direction with respect to a central axis of the via conductor, and the metal post is formed such that a central axis of the metal post is shifted in the predetermined direction with respect to the central axis of the conductor pad.

20 Claims, 4 Drawing Sheets

WIRING SUBSTRATE HAVING METAL POST OFFSET FROM CONDUCTOR PAD AND METHOD FOR MANUFACTURING WIRING SUBSTRATE

CROSS-REFERENCE TO RELATED APPLICATIONS

The present application is based upon and claims the benefit of priority to Japanese Patent Application No. 2020-118811, filed Jul. 9, 2020, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2016-18806 describes a wiring substrate having a metal post that is formed on a wiring layer connected to a via and protrudes from an upper surface of a solder resist layer covering the wiring layer. A structure composed of the via, the wiring layer, and the metal post has a left-right symmetrical shape. That is, the via, the wiring layer, and the metal post have a common central axis. The entire contents of this publication are incorporated herein by reference.

SUMMARY OF THE INVENTION

According to one aspect of the present invention, a wiring substrate includes a resin insulating layer, a via conductor formed in the resin insulating layer such that the via conductor is penetrating through the resin insulating layer, a conductor pad formed on the resin insulating layer and connected to the via conductor, a coating insulating layer formed on the resin insulating layer such that the coating insulating layer is covering the conductor pad, and a metal post formed on the conductor pad and protruding from the coating insulating layer. The conductor pad is formed such that a central axis of the conductor pad is shifted in a predetermined direction with respect to a central axis of the via conductor, and the metal post is formed such that a central axis of the metal post is shifted in the predetermined direction with respect to the central axis of the conductor pad.

According to another aspect of the present invention, a method of manufacturing a wiring substrate includes preparing a laminate including a conductor layer and a resin insulating layer laminated on the conductor layer, forming a hole in the resin insulating layer such that the hole is connected to the conductor layer, forming a plating resist on the resin insulating layer such that the plating resist has a pad opening formed therein and connected to the hole, filling the hole and the pad opening with a conductor such that a via conductor is formed in the hole and a conductor pad is formed in the pad opening, forming a resist layer on the conductor pad such that the resist layer has a post opening formed therein and connected to the conductor pad, and filling the post opening with a conductor such that a metal post is formed in the post opening. The forming of the plating resist includes forming the pad opening such that the pad opening has a center that is shifted from a center of the hole in a predetermined direction, and the forming of resist layer includes forming the post opening such that the post opening has a center that is shifted from a center of the conductor pad in the predetermined direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
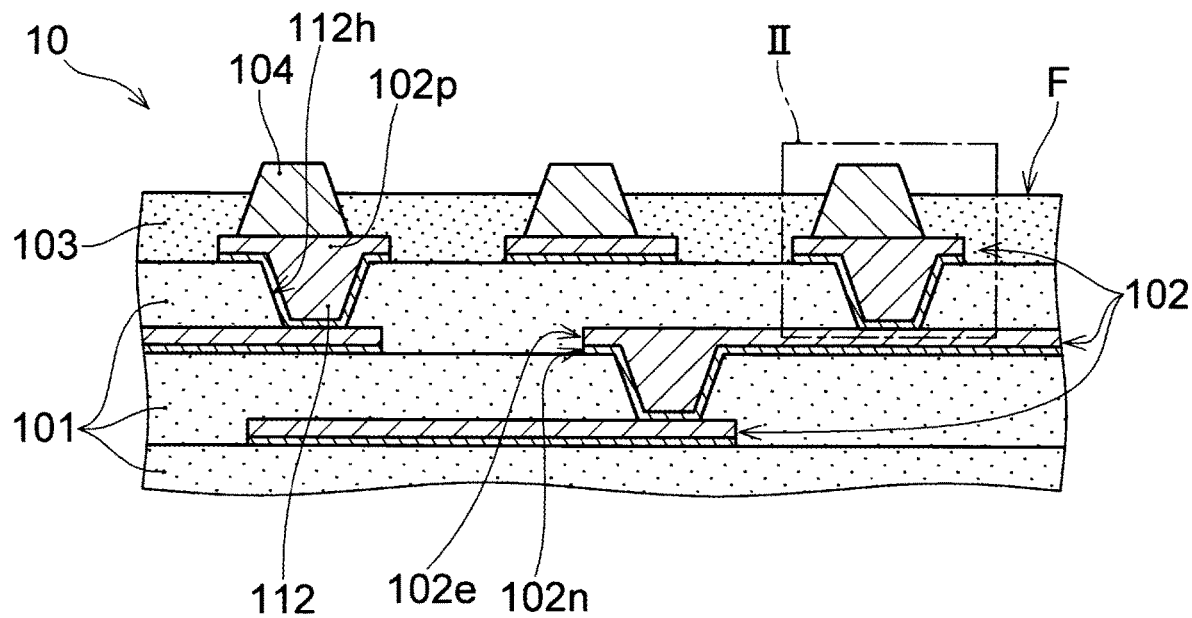
FIG. 1 is a cross-sectional view partially illustrating an example of a wiring substrate according to an embodiment of the present invention.

Embodiments will now be described with reference to the accompanying drawings, wherein like reference numerals designate corresponding or identical elements throughout the various drawings.

A wiring substrate according to an embodiment of the present invention is described with reference to the drawings. The drawings to be referred to below are drawn with features according to an embodiment of the present invention emphasized for ease of understanding, without intending to show exact ratios of dimensions of structural elements. FIG. 1 partially illustrates a cross section of a wiring substrate 10, which is an example of the wiring substrate of the present embodiment. The wiring substrate 10 is formed of insulating layers and conductor layers, which are alternately laminated, and, among the insulating layers and conductor layers, resin insulating layers 101, a coating insulating layer 103 and conductor layers 102 are illustrated in FIG. 1. A surface (F) on one side of the wiring substrate 10 illustrated in FIG. 1 is formed as a component mounting surface on which an external electronic component such as a semiconductor element is mounted. The component mounting surface (F) of the wiring substrate 10 illustrated in FIG. 1 is formed of surfaces of the coating insulating layer 103 and metal posts 104 protruding from the coating insulating layer 103.

In the description of the wiring substrate 10 of the present embodiment, of each element of the wiring substrate 10, a component mounting surface (F) side, that is, an upper side on a drawing sheet is referred to as an "upper side" or simply "upper," and an opposite side thereof is referred to as a "lower side" or simply "lower." Therefore, an end part on the upper side of each element is also referred to as an "upper end" thereof, and an end part of the lower side of each element is also referred to as a "lower end" thereof.

In FIG. 1, among the multiple resin insulating layers 101 and the multiple conductor layers 102 of the wiring substrate 10, three resin insulating layers 101 and three conductor layers 102 on the component mounting surface (F) side are illustrated. The number of the resin insulating layers 101 and the number of the conductor layers 102 of the wiring substrate 10 of the embodiment are not particularly limited and can be increased or decreased as appropriate. By including more conductor layers in the wiring substrate 10, a larger and more complicated electrical circuit can be formed in the wiring substrate 10 without increasing a planar size of the wiring substrate 10.

The conductor layers 102 are in contact with the resin insulating layers 101 and can have any conductor patterns. Each conductor layer 102 is electrically connected via via conductors 112, which are formed penetrating a resin insulating layer 101, to a conductor layer 102 on an opposite side of the resin insulating layer 101. In the example illustrated in FIG. 1, each of the via conductors 112 has a tapered shape that is reduced in diameter toward an opposite side from the component mounting surface (F). However, the shape of each of the via conductors 112 is not limited to this. It is also possible that each of the via conductors 112 has a shape that is reduced in diameter toward the component mounting surface (F), or is formed in a cylindrical shape that has the same diameter in a thickness direction of the resin insulating layers 101 and is substantially orthogonal to the conductor layers 102. For convenience, the term "reduced in diameter" is used. However, an opening shape of each of the via conductors 112 is not necessarily limited to a circular shape. The term "reduced in diameter" simply means that a longest distance between two points on an outer circumference of a horizontal cross section of each of the via conductors 112 is reduced.

Among the three conductor layers 102 illustrated in FIG. 1, the conductor layer 102 formed closest to the component mounting surface (F) includes conductor pads (102p). The conductor pads (102p) are electrically connected via the metal posts 104 formed thereon to connection pads of an external electronic component such as a semiconductor element. The metal posts 104 protrude to the component mounting surface (F) side from the coating insulating layer 103, which is formed so as to cover surfaces of the conductor pads (102p) and the resin insulating layer 101.

The metal posts 104 of the wiring substrate 10 in the example illustrated in FIG. 1 are reduced in diameter from a lower end (base end) side connected to the conductor pads (102p) toward an upper end side (the component mounting surface (F) side) on an opposite side. When the metal posts 104 are reduced in diameter from the base end side toward the upper end side, excessive proximity between the upper ends of adjacent metal posts 104 can be suppressed while a connection area with the conductor pads (102p) on the base end side is satisfactorily ensured. In particular, the diameter of the portion of each of the metal posts 104 protruding from the coating insulating layer 103 is preferably equal to or less than the diameter of the portion of each of the metal posts 104 covered by the coating insulating layer 103. Occurrence of a defect such as a short circuit between the multiple metal posts 104 may be suppressed. However, the shape of the metal posts 104 is not limited to this. It is also possible that the metal posts 104 are formed to have substantially the same diameter from the base end side toward the upper end side. Similar to the via conductors 112, a horizontal cross-sectional shape of each of the metal posts 104 is not limited to a circular shape.

In the wiring substrate 10 of the embodiment, a conductor pad (102p) connected to a via conductor 112 is shifted in a predetermined direction with respect to the via conductor 112. Then, a metal post 104 connected to the conductor pad (102p) is also shifting in the same direction. Specifically, in the example illustrated in FIG. 1, a center of the conductor pad (102p) in a horizontal direction (left-right direction on the drawing sheet) is positioned off a center of the via conductor 112 in the horizontal direction toward a left side on the drawing sheet. Then, a center of the metal post 104 in the horizontal direction is shifted from the center of the conductor pad (102p) in the horizontal direction toward the left side on the drawing sheet. In the example illustrated in FIG. 1, the multiple conductor pads (102p) and the multiple metal posts 104 of the wiring substrate 10 are shifted in the same direction. By having such a structure, as will be described in detail later, the wiring substrate 10 may have an increased resistance with respect to an external force from a specific direction on the component mounting surface (F) side of the wiring substrate 10.

The resin insulating layers 101 of the wiring substrate 10 are each formed using any insulating resin such as an epoxy resin. A polyimide resin, a BT resin (bismaleimide-triazine resin), a polyphenylene ether resin, a phenol resin or the like can also be used. The resin insulating layers 101 may each contain inorganic filler such as silica. In the wiring substrate 10 in the example illustrated in FIG. 1, the resin insulating layers 101 do not each contain a core material. However, when necessary, the resin insulating layers 101 may each contain a core material such as a glass fiber or an aramid fiber. By containing a core material, the wiring substrate 10 can be improved in strength. The multiple resin insulating layers 101 may be respectively formed of different materials, or may all be formed of the same material.

The conductor layers 102 can each be formed using any material having suitable conductivity such as copper or nickel. The conductor layers 102 are each formed of, for example, a metal film layer (preferably an electroless copper plating film layer) or an electrolytic plating film layer (preferably an electrolytic copper plating film layer), or a combination thereof. In the example illustrated in FIG. 1, the conductor layers 102 are each formed to have a two-layer structure including a metal film layer (102n) and an electrolytic plating film layer (102e). However, the structure of each of the conductor layers 102 forming the wiring substrate 10 is not limited to the multilayer structure illustrated in FIG. 1. For example, the conductor layers 102 may be each formed to have a three-layer structure including a metal foil layer, a metal film layer, and an electrolytic plating film layer.

As illustrated in FIG. 1, the via conductors 112 can be integrally formed with the metal film layer (102n) and the electrolytic plating film layer (102e), which form the conductor layers 102. In the example illustrated in FIG. 1, the via conductors 112 are so-called filled vias filling conduction holes (112h), and are formed of a metal film layer and an electrolytic plating film layer, which cover bottom surfaces and side surfaces in the conduction holes (112h).

The coating insulating layer 103 can be formed using any insulating resin material. The coating insulating layer 103 is formed using, for example, a photosensitive polyimide resin or epoxy resin. The coating insulating layer 103 covers portions of the conductor pads (102p) and portions of side surfaces of the metal posts 104 formed on the conductor pads (102p), and covers a surface of the resin insulating layer 101 exposed between the multiple conductor pads (102p). The coating insulating layer 103 can be a solder resist layer.

The metal posts 104 are formed, for example, using copper or nickel. As will be described in detail later, the metal posts 104 can be formed by performing electrolytic plating of any metal material on the conductor pads (102p). When the metal posts 104 contains the same metal material as the metal contained in the conductor pads (102p), connectivity between the conductor pads (102p) and the metal posts 104 may be improved. A protective layer (not illustrated in the drawings) may be formed on upper ends of the metal posts 104. For example, a protective layer formed of Ni/Sn, Ni/Pd/Au, or the like is provided. A protective layer may be formed of Ni/Au or Sn. An OSP film may be formed.

Figure 2:
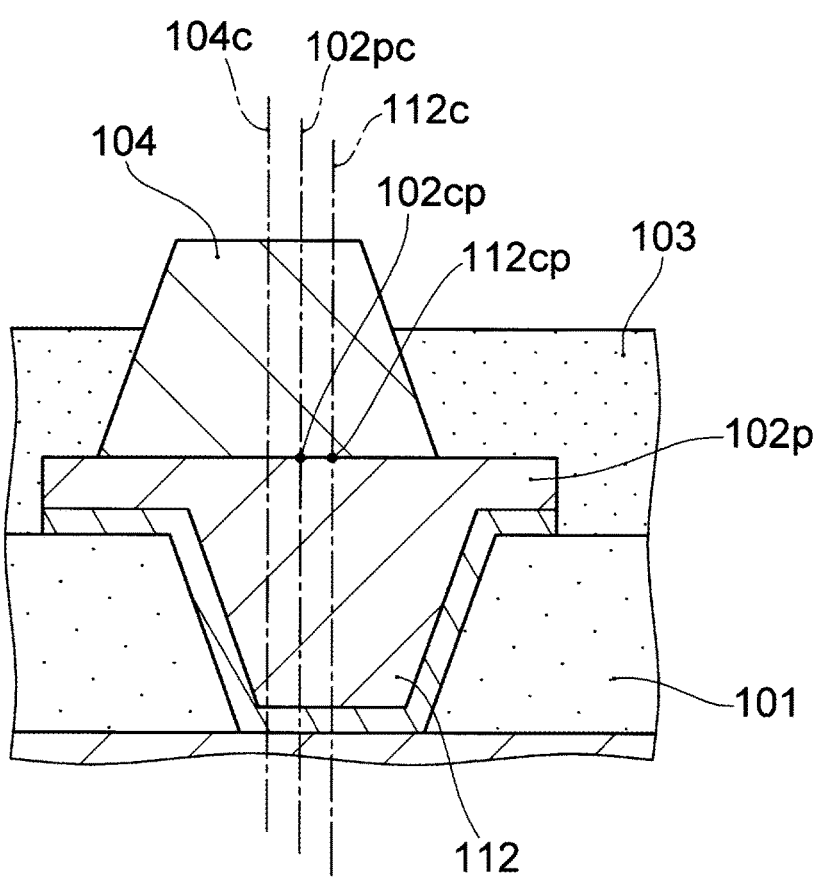
FIG. 2 is a partial enlarged cross-sectional view of the wiring substrate of FIG. 1.

FIG. 2 illustrates an enlarged view of a region (II) surrounded by a one-dot chain line in FIG. 1. As illustrated in FIG. 2, in the wiring substrate 10 of the present embodiment, a via conductor 112, a conductor pad (102p), and a metal post 104, which are connected to each other, respectively have central axes at different positions. Specifically, a central axis (102pc) of the conductor pad (102p) indicated by a one-dot chain line is shifted to a left side on the drawing sheet in FIG. 2 with respect to a central axis (112c) of the via conductor 112 indicated by a broken line. And, a central axis (104c) of the metal post 104 indicated by a two-dot chain line is also shifted to a left side on the drawing sheet with respect to the central axis (102pc) of the conductor pad (102p). In other words, in a connection structure of the via conductor 112, the conductor pad (102p), and the metal post 104, the central axis (102pc) of the conductor pad (102p) and the central axis (104c) of the metal post 104 are shifted in the same direction with respect to the central axis (112c) of the via conductor 112. And, a degree of the shift of the central axis (104c) of the metal post 104 with respect to the central axis (112c) of the via conductor 112 is larger than a degree of the shift of the central axis (102pc) of the conductor pad (102p) with respect to the central axis (112c) of the via conductor 112.

When the central axis (102pc) is shifted in a predetermined direction with respect to the central axis (112c), and the central axis (104c) is shifted in the same direction with respect to the central axis (102pc), the via conductor 112, the conductor pad (102p), and the metal post 104 can form a stronger structure. For example, the metal post 104 can have a high physical resistance against an external force in a case such as when an electronic component is mounted on the component mounting surface (F). Specifically, in particular, in a case where an external force from a predetermined direction is likely to be applied to the metal post 104 such as when an electronic component is mounted, a high rigidity is achieved against the external force by shifting the conductor pad (102p) and the metal post 104 in that direction. Occurrence of defects such as peeling at connecting portions between the via conductor 112, the conductor pad (102p), and the metal post 104 can be suppressed when a component is mounted.

The structure in which the conductor pad (102p) and the metal post 104 are shifted with respect to the via conductor 112 is preferably common to the multiple metal posts 104 and the multiple conductor pads (102p) of the wiring substrate 10. The above-described resistance against an external force applied to the component mounting surface (F) can be increased.

In the example illustrated in FIG. 2, in the connection between the conductor pad (102p) and the metal post 104, a center (point (102cp)) of an upper surface of the conductor pad (102p) is connected to the metal post 104. Further, a point (112cp) of the upper surface of the conductor par (102p), where the upper surface of the conductor pad (102p) intersects the central axis (112c) of the via conductor 112, is also connected to the metal post 104. That is, the central axis (102pc) and the central axis (112c) are within an inner region of a connection surface between the metal post 104 and the conductor pad (102p). By having such a structure, in a structure having the via conductor 112, the conductor pad (102p), and the metal post 104 as structural elements, a decrease in rigidity due to excessive uneven distribution (shift) of the structural elements is suppressed. From a point of view of suppressing the decrease in rigidity due to the uneven distribution of the structural elements, it is even more preferable that the central axis (112c) and the central axis (102pc) are within an inner region of an upper surface of the metal post 104.

Figure 3:
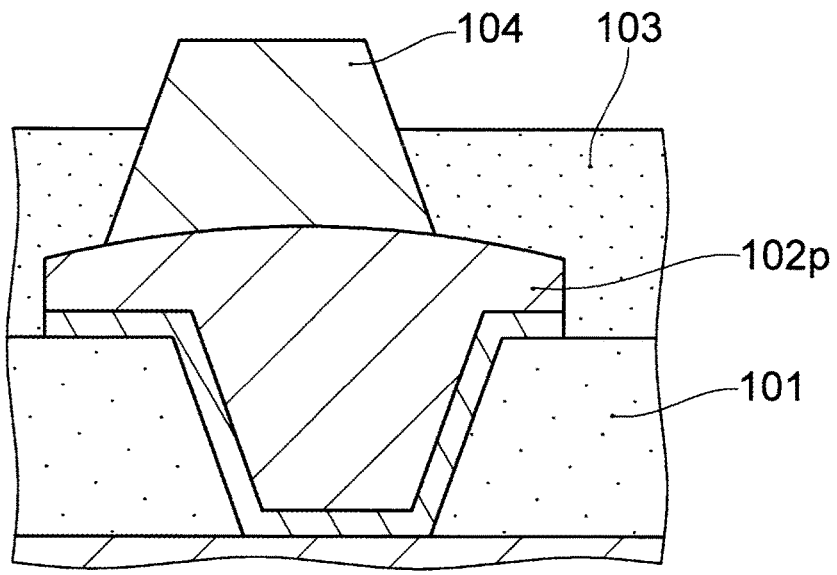
FIG. 3 is a cross-sectional view illustrating a different example of the wiring substrate illustrated in FIG. 2.

FIG. 3 illustrates an example in which a conductor pad (102p) has a structure different from that illustrated in FIG. 2. In the example illustrated in FIG. 3, a surface of the conductor pad (102p) on a side (upper side) connecting to a metal post 104 bulges toward the metal post 104. That is, the upper surface of the conductor pad (102p) is curved so as to be convex toward the metal post 104 side. When the surface of the conductor pad (102p) connecting to the metal post 104 is curved, a large connection area can be ensured, and the structure can have an even higher rigidity. Therefore, connection reliability between the conductor pad (102p) and the metal post 104 can be improved.

From a point of view of improving the connection reliability between the conductor pad (102p) and the metal post 104, it is preferable that an apex (point farthest from the resin insulating layer 101) of a bulging portion of the conductor pad (102p) (a point farthest from the resin insulating layer 101) is connected to the metal post 104. An upper surface of the metal post 104 may also bulge along with the bulging shape of the conductor pad (102p). Bondability with a connecting member such as a solder interposed between the metal post 104 and a connecting pad of an electronic component or the like may be improved. When the upper end surface of the metal post 104 bulges, connection reliability between the metal post 104 and a connection pad of an electronic component or the like can be improved.

In the following, a method for manufacturing the wiring substrate 10 illustrated in FIG. 1 is described with reference to FIGS. 4A-4G. In FIGS. 4A-4G, similar to FIG. 1, the wiring substrate 10 is not entirely illustrated, and only a partial cross section of the component mounting surface (F) side where the metal posts 104 are formed is illustrated. Also in the following description, in each element, a side) on the component mounting surface (F) side of the wiring substrate 10 (an upper side in a drawing sheet) is referred to as "upper" or an "upper side," and is also referred to as an "outer side" or simply "outer."

Figure 4A:
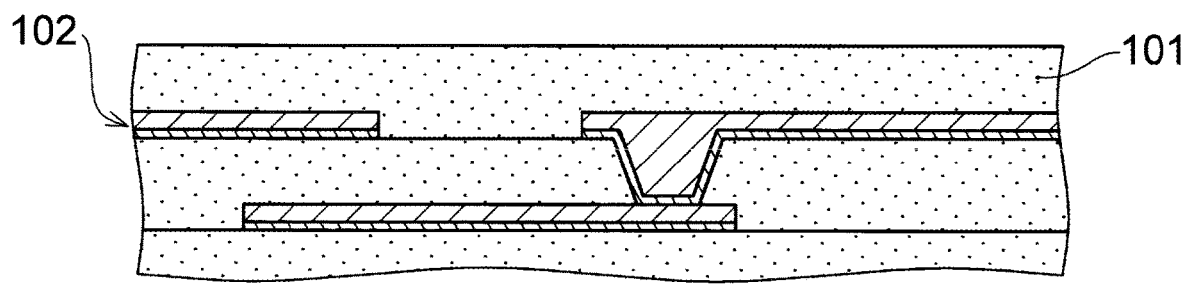
FIG. 4A is a cross-sectional view illustrating a method for manufacturing a wiring substrate according to an embodiment of the present invention.

First, as illustrated in FIG. 4A, a laminate (wiring substrate) (10p) in which processing up to the lamination of the outermost resin insulating layer 101 has been completed is prepared. The wiring substrate (10p) is manufactured using a general method for manufacturing a wiring substrate using a build-up method in which multiple insulating layers and multiple conductor layers are laminated.

Figure 4B:
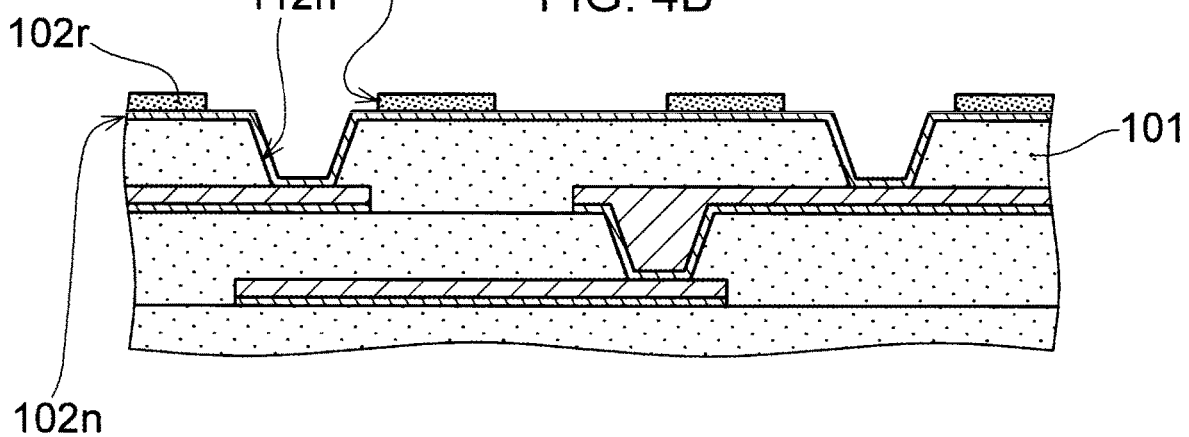
FIG. 4B is a cross-sectional view illustrating the method for manufacturing a wiring substrate according to the embodiment of the present invention.

Next, as illustrated in FIG. 4B, the conduction holes (112h) penetrating the outermost resin insulating layer 101 are formed at positions corresponding to formation locations of the via conductors 112 in the resin insulating layer 101 of the wiring substrate (10p). The conduction holes (112h) are drilled by irradiation of laser such as CO2 laser or YAG laser. Then, the metal film layer (102n), which is, for example, an electroless copper plating film layer, is formed on inner sides of the conduction holes (112h) and over the entire surface of the resin insulating layer 101.

Subsequently, a plating resist (102r) for electrolytic plating is formed on the metal film layer (102n). The plating resist (102r) is formed using, for example, a dry film resist containing an acrylic resin or the like. The plating resist (102r) is formed to have openings (pad openings) (102rh) according to a conductor pattern including the conductor pads (102p) to be included in the outermost conductor layer 102 of the wiring substrate 10. The openings (102rh) are formed at positions where the centers of the openings are respectively shifted from the centers of the conduction holes (112h) in a predetermined direction. The openings (102rh) can be formed using photolithography by exposure and development using a photomask having a suitable opening pattern.

Figure 4C:
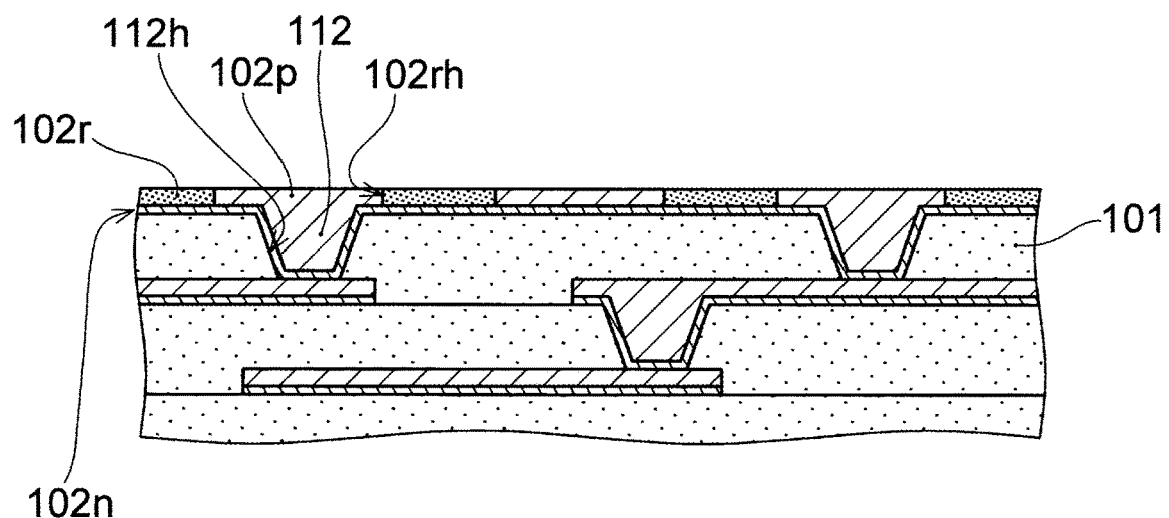
FIG. 4C is a cross-sectional view illustrating the method for manufacturing a wiring substrate according to the embodiment of the present invention.

Next, as illustrated in FIG. 4C, the conduction holes (112h) of the resin insulating layer 101 and the openings (102rh) of the plating resist (102r) are filled with a conductor by electrolytic plating using the metal film layer (102n) as a power feeding layer. The via conductors 112 and the conductor pads (102p) are formed. At this stage, the centers of the conductor pads (102p) are respectively shifted with respect to the centers of the via conductors 112 in a predetermined direction. In the example illustrated in FIG. 4C, the upper surfaces of the conductor pads (102p) are formed flat. By appropriately adjusting conditions (such as temperature, current density, and plating time) of the electrolytic plating in which the metal film layer (102n) is used as a power feeding layer, the conductor pads (102p) that bulge upward can also be obtained. After the formation of the conductor pads (102p), the plating resist (102r) is removed.

Figure 4D:
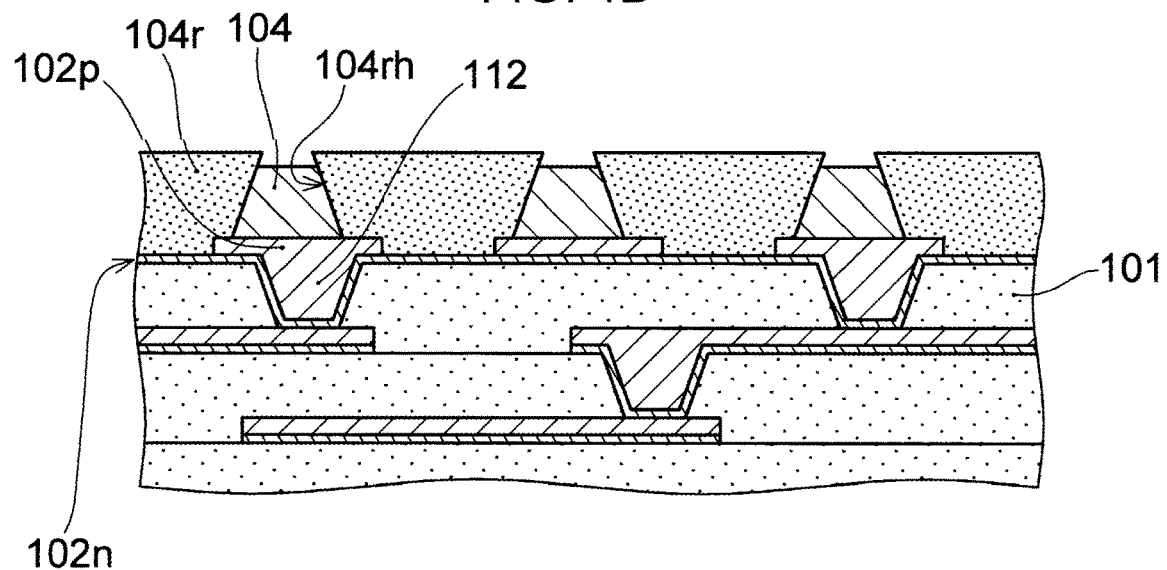
FIG. 4D is a cross-sectional view illustrating the method for manufacturing a wiring substrate according to the embodiment of the present invention.

Next, as illustrated in FIG. 4D, a resist layer (104r) for forming the metal posts 104 is formed on the metal film layer (102n) exposed by the removal of the plating resist (102r), and on the conductor pads (102p). The resist layer (104r) is formed using, for example, a photosensitive dry film resist containing an acrylic resin or the like. Openings (post openings) (104rh) for forming the metal posts 104 are formed in the resist layer (104r).

Similar to the formation of the opening (102rh) in the plating resist (102r) described above, photolithography is used for the formation of the openings (104rh). By adjusting the position of the photomask in the photolithography, the openings (104rh) are formed at positions that are respectively shifted from the conductor pads (102p). Specifically, the openings (104rh) are formed at positions where the centers of the openings (104rh) respectively shift off the centers of the conductor pads (102p) in the same direction as the direction in which the centers of the conductor pads (102p) respectively shift from the centers of the via conductors 112. By using photolithography for the formation of the pad openings (102rh) in the plating resist (102r) and the formation of the post openings (104rh), the openings (104rh) can be easily formed at positions that are respectively shifted in a predetermined direction with respect to the conductor pads (102p). Specifically, for example, first, a first alignment mark is used for adjusting the position of the photomask in the formation of the openings (102rh). Then, a second alignment mark at a position shifted from the first alignment mark in the predetermined direction is used for adjusting the position of the photomask in the formation of the openings (104rh). By simply adjusting the position of the photomask, the positions at which the openings (104rh) are formed can be easily shifted in the predetermined direction with respect to the conductor pads (102p).

Subsequently, the metal posts 104 are formed by performing electrolytic plating using the metal film layer (102n) as a power feeding layer on inner surfaces of the openings (104rh) of the resist layer (104r). The electrolytic plating used for the formation of the metal posts 104 is, for example, electrolytic copper plating or electrolytic nickel plating. A plating layer formed by the electrolytic plating grows in a so-called bottom-up manner upward from the surfaces of the conductor pads (102p), which are bottom surfaces of the openings (104rh).

The electrolytic plating is terminated in a state in which the openings (104rh) are filled to a desired position, and the formation of the metal posts 104 is completed. The metal posts 104 are formed in a state in which the centers of the metal posts 104 are respectively shifted in a predetermined direction from the centers of the conductor pads (102p). The shape of the upper surface (upper end surface) of each metal post 104 can change depending on the shape of the surface of the conductor pad (102p) in contact with the metal post 104, a condition of the electrolytic plating, and the like. A surface protective film (not illustrated in the drawings) formed of Ni/Sn, Au, Ni/Au, Ni/Pd/Au, or the like can be formed on the upper end surface of each of the metal posts 104.

Figure 4E:
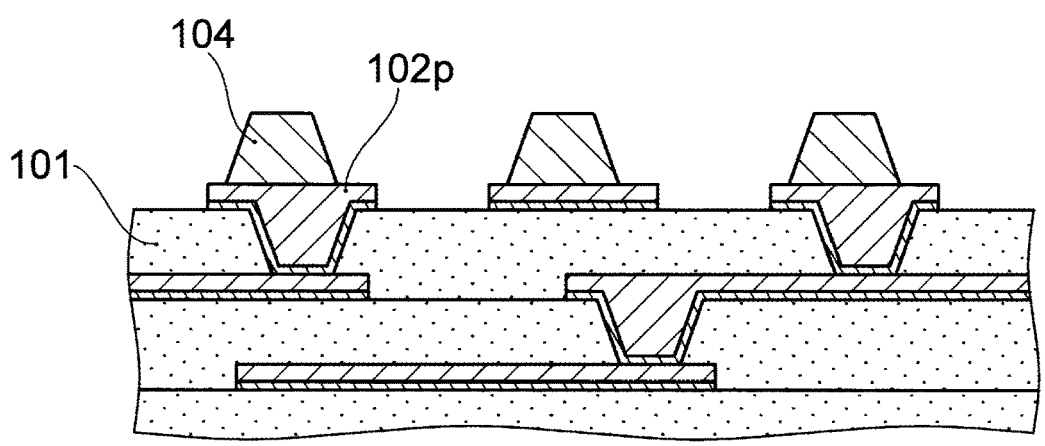
FIG. 4E is a cross-sectional view illustrating the method for manufacturing a wiring substrate according to the embodiment of the present invention.

Next, as illustrated in FIG. 4E, the resist layer (104r) is removed. The metal film layer (102n) exposed by the removal of the resist layer (104r) is removed by etching. The conductor pads (102p) and the metal posts 104 are completely exposed, and the surface of the resin insulating layer 101 is exposed between the multiple conductor pads (102p).

Figure 4F:
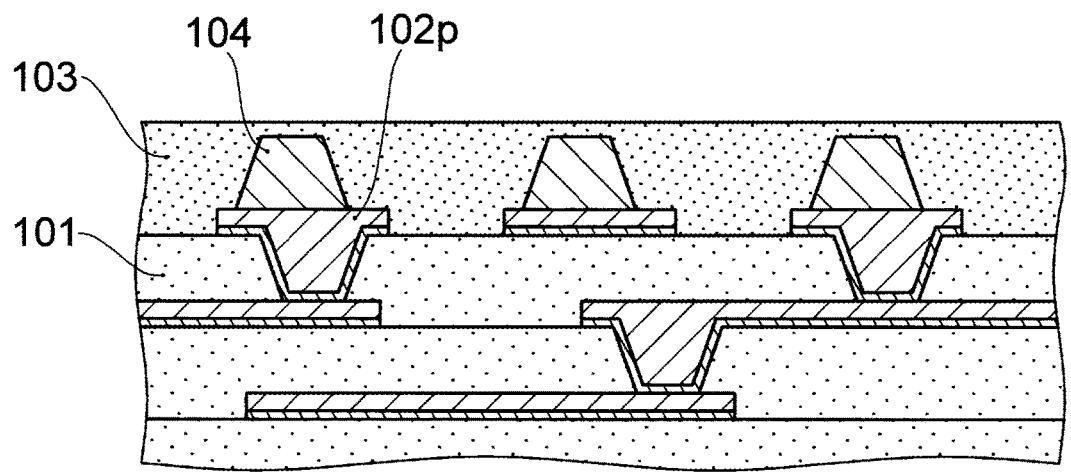
FIG. 4F is a cross-sectional view illustrating the method for manufacturing a wiring substrate according to the embodiment of the present invention.

Next, as illustrated in FIG. 4F, the coating insulating layer 103 is formed so as to cover the surface of the resin insulating layer 101 exposed between the multiple conductor pads (102p), and cover the conductor pads (102p) and the metal posts 104. The coating insulating layer 103 completely covers the conductor pads (102p) and the metal posts 104. As a result, the metal posts 104 are embedded in the coating insulating layer 103.

Figure 4G:
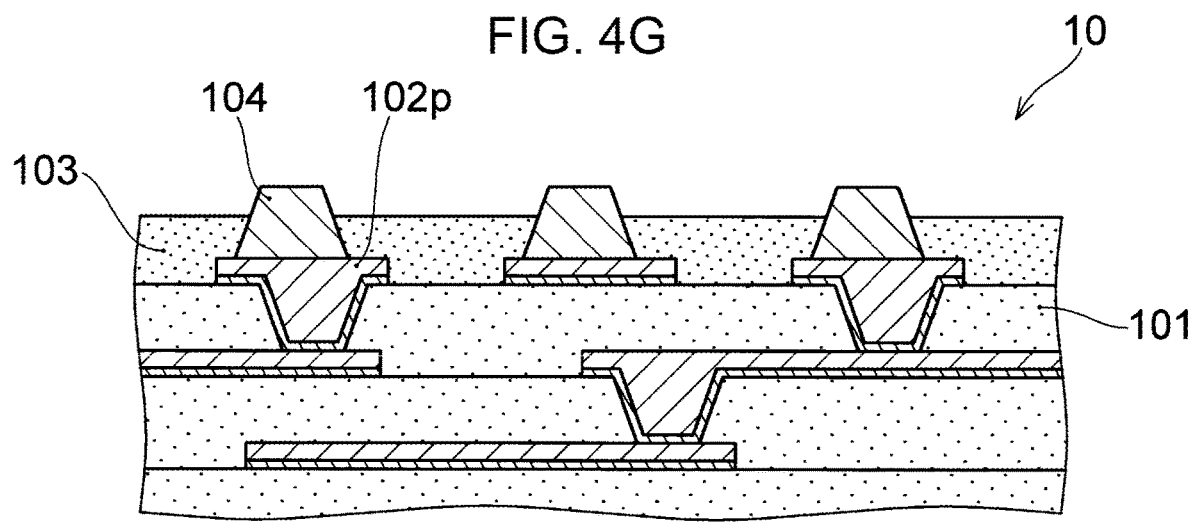
FIG. 4G is a cross-sectional view illustrating the method for manufacturing the wiring substrate of the embodiment of the present invention.

Next, as illustrated in FIG. 4G, a portion of the coating insulating layer 103 in the thickness direction is removed, and a portion of each of the metal posts 104 is exposed from the coating insulating layer 103. The metal posts 104 are in a state of protruding upward from the coating insulating layer 103. For the partial removal of the coating insulating layer 103 in the thickness direction, for example, a dry process such as plasma etching using $CF_4$ or $CF_4+O_2$ can be used. Further, it is also possible that the coating insulating layer 103 is partially removed in the thickness direction by a blast treatment to expose the metal posts 104. Through the above processes, the wiring substrate 10 illustrated in FIG. 1 is completed. A surface protective film (not illustrated in the drawings) formed of heat-resistant preflux or the like may be formed on portions of the metal posts 104 exposed from the coating insulating layer 103.

In the manufacture of the wiring substrate 10 of the embodiment, after the removal of the plating resist (102r)

following the formation of the conductor pads (102p) illustrated in FIG. 4C, the wiring substrate 10 may be manufactured through processes different from the above-described processes. For example, the resist layer (104r) is not formed on the metal film layer (102n), and, following the removal of the plating resist (102r), the metal film layer (102n) exposed between the conductor pads (102p) is also removed. The coating insulating layer 103 is formed on the surface of the resin insulating layer 101 exposed by the removal of the metal film layer (102n), and on the conductor pads (102p).

For example, the coating insulating layer 103 as a solder resist covers the surface of the resin insulating layer 101 and covers the conductor pads (102p). Then, openings exposing the conductor pads (102p) are formed in the coating insulating layer 103 by exposure and development. In this case, similar to the case where the openings (104rh) are formed in the resist layer (104r), the openings are formed such that the centers of the openings are respectively shifted from the centers of the conductor pads (102p) in the predetermined direction. Next, the metal posts 104 are formed by electroless plating in the openings formed in the coating insulating layer 103. In this case, in the formation of the metal posts 104, a catalyst layer for plating deposition can be formed in the openings prior to electroless plating. For the catalyst layer, for example, a metal such as palladium (Pd), gold (Au), platinum (Pt), or ruthenium (Ru) can be used. An electroless plating layer is formed only in the openings, and the metal posts 104 are formed. Following the formation of the metal posts 104, a portion of the coating insulating layer 103 in the thickness direction is removed. The metal posts 104 are partially exposed from the coating insulating layer 103 and protrude upward. The formation of the wiring substrate 10 is completed.

The wiring substrate of the embodiment is not limited to a wiring substrate having the structures exemplified in the drawings, or the structures or materials exemplified in the present specification. For example, the conductor layer 102 closest to the component mounting surface (F) may include different conductor patterns in addition to the conductor pads (102p). Further, the method for manufacturing the wiring substrate of the embodiment is not limited to the method described with reference to the drawings, and conditions, processing order, and the like of the method can be modified as appropriate. Depending on a structure of an actually manufactured wiring substrate, some of the processes may be omitted, or other processes may be added.

The structure formed by the metal post, the wiring layer (conductor pad), and the via in the wiring substrate of Japanese Patent Application Laid-Open Publication No. 2016-18806 is thought to have a low physical resistance against an external force applied from a direction other than a direction of the central axis (thickness direction of the wiring substrate). For example, it is thought that a desired rigidity against an external force applied from the metal post side in an oblique direction with respect to the central axis cannot be obtained, and in particular, there is a risk that a defect such as peeling or a crack is likely to occur at a connecting portion between the metal post and the wiring layer.

A wiring substrate according to an embodiment of the present invention includes: a resin insulating layer; a via conductor that penetrates the resin insulating layer; a conductor pad that is connected to the via conductor; a coating insulating layer that covers the conductor pad; and a metal post that is formed on the conductor pad and protrudes from the coating insulating layer. A central axis of the conductor pad is shifted in a predetermined direction with respect to a central axis of the via conductor, and a central axis of the metal post is shifted in the predetermined direction with respect to the central axis of the conductor pad.

A method for manufacturing a wiring substrate of the present invention includes: preparing a laminate in which a resin insulating layer is laminated on a conductor layer, and forming a conduction hole in the resin insulating layer; forming a plating resist on the resin insulating layer, and forming a pad opening in the plating resist; forming a via conductor by filling the conduction hole with a conductor, and forming a conductor pad by filling the pad opening with a conductor; forming a resist layer on the conductor pad, and forming a post opening in the resist layer; and forming a metal post by filling the post opening with a conductor. The pad opening is formed by photolithography so as to have a center at a position that shifts from a center of the conduction hole in a predetermined direction, and the post opening is formed by photolithography so as to have a center at a position that shifts from a center of the conductor pad in the predetermined direction.

According to an embodiment of the present invention, a connection structure of a via conductor, a conductor pad, and a metal post, having a high resistance against an external force, can be obtained. A highly reliable wiring substrate in which occurrence of defects such as peeling or cracks at connecting portions between elements is suppressed can be provided.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   a resin insulating layer;
   a via conductor formed in the resin insulating layer such that the via conductor is penetrating through the resin insulating layer;
   a conductor pad formed on the resin insulating layer and connected to the via conductor;
   a coating insulating layer formed on the resin insulating layer such that the coating insulating layer is covering the conductor pad; and
   a metal post formed directly on the conductor pad and protruding from the coating insulating layer such that the metal post is reduced in diameter from a base end side connected to the conductor pad toward an opposite side with respect to the base end side,
   wherein the conductor pad is formed such that a central axis of the conductor pad is shifted in a predetermined direction with respect to a central axis of the via conductor, and the metal post is formed on a surface of the conductor pad such that a central axis of the metal post is shifted in the predetermined direction with respect to the central axis of the conductor pad, the metal post is positioned over the via conductor and overlapping with the central axis of the via conductor and the via conductor is positioned below the metal post and overlapping with the central axis of the metal post.

2. The wiring substrate according to claim 1, further comprising:
   a second via conductor formed in the resin insulating layer such that the second via conductor is penetrating through the resin insulating layer;
   a second conductor pad formed on the resin insulating layer and connected to the second via conductor; and a second metal post formed on the second conductor pad and protruding from the coating insulating layer, wherein the second conductor pad is formed such that a central axis of the second conductor pad is shifted in a predetermined direction with respect to a central axis of the second via conductor, and the second metal post is formed such that a central axis of the second metal post is shifted in the predetermined direction with respect to the central axis of the second conductor pad.

3. The wiring substrate according to claim 2, wherein the metal post is formed on the surface of the conductor pad such that the metal post is positioned over a center of the surface of the conductor pad, and the second metal post is formed on a surface of the second conductor pad such that the second metal post is positioned over a center of the surface of the second conductor pad.

4. The wiring substrate according to claim 3, wherein the second metal post is formed on a surface of the second conductor pad such that the second metal post is positioned over the central axis of the second via conductor.

5. The wiring substrate according to claim 2, wherein the second metal post is formed on a surface of the second conductor pad such that the second metal post is positioned over the central axis of the second via conductor.

6. The wiring substrate according to claim 2, wherein the conductor pad and the metal post comprise a same metal material, and the second conductor pad and the second metal post comprise a same metal material.

7. The wiring substrate according to claim 2, wherein the metal post and second metal post are formed such that the metal post and second metal post have protruding portions protruding from the coating insulating layer and covered portions covered by the coating insulating layer, respectively, and that diameters of the protruding portions are less than diameters of the covered portions.

8. The wiring substrate according to claim 1, wherein the metal post is formed on the surface of the conductor pad such that the metal post is positioned over a center of the surface of the conductor pad.

9. The wiring substrate according to claim 8, wherein the metal post is formed on the surface of the conductor pad such that the central axis of the metal post is shifted greater than the central axis of the conductor pad with respect to the central axis of the via conductor.

10. The wiring substrate according to claim 8, wherein the conductor pad and the metal post comprise a same metal material.

11. The wiring substrate according to claim 8, wherein the metal post is formed such that the metal post has a protruding portion protruding from the coating insulating layer and a covered portion covered by the coating insulating layer and that a diameter of the protruding portion is less than a diameter of the covered portion.

12. The wiring substrate according to claim 1, wherein the metal post is formed on the surface of the conductor pad such that the central axis of the metal post is shifted greater than the central axis of the conductor pad with respect to the central axis of the via conductor.

13. The wiring substrate according to claim 12, wherein the conductor pad and the metal post comprise a same metal material.

14. The wiring substrate according to claim 12, wherein the metal post is formed such that the metal post has a protruding portion protruding from the coating insulating layer and a covered portion covered by the coating insulating layer and that a diameter of the protruding portion is less than a diameter of the covered portion.

15. The wiring substrate according to claim 1, wherein the conductor pad and the metal post comprise a same metal material.

16. The wiring substrate according to claim 15, wherein the metal post is formed such that the metal post has a protruding portion protruding from the coating insulating layer and a covered portion covered by the coating insulating layer and that a diameter of the protruding portion is less than a diameter of the covered portion.

17. The wiring substrate according to claim 1, wherein the metal post is formed such that the metal post has a protruding portion protruding from the coating insulating layer and a covered portion covered by the coating insulating layer and that a diameter of the protruding portion is less than a diameter of the covered portion.

18. A method of manufacturing a wiring substrate, comprising:
    preparing a laminate comprising a conductor layer and a resin insulating layer laminated on the conductor layer;
    forming a hole in the resin insulating layer such that the hole is connected to the conductor layer;
    forming a plating resist on the resin insulating layer such that the plating resist has a pad opening formed therein and connected to the hole;
    filling the hole and the pad opening with a conductor such that a via conductor is formed in the hole and a conductor pad is formed in the pad opening;
    forming a resist layer on the conductor pad such that the resist layer has a post opening formed therein and connected to the conductor pad; and
    filling the post opening with a conductor such that a metal post is formed in the post opening and directly on a surface of the conductor pad and is reduced in diameter from a base end side connected to the conductor pad toward an opposite side with respect to the base end side,
    wherein the forming of the plating resist includes forming the pad opening such that the pad opening has a center that is shifted from a center of the hole in a predetermined direction, and the forming of resist layer includes forming the post opening such that the post opening has a center that is shifted from a center of the conductor pad in the predetermined direction and is formed over the via conductor and overlapping with a central axis of the via conductor and the via conductor is positioned below the post opening and overlapping with the central axis of the post opening.

19. The method according to claim 18, wherein the pad opening is formed by photolithography, and the post opening is formed by photolithography.

20. The method according to claim 19, wherein the forming of the pad opening includes using a first alignment mark for adjusting a position of a photomask in the photolithography, and the forming of the post opening includes using a second alignment mark at a position that is shifted from that of the first alignment mark in the predetermined direction for adjusting a position of a photomask in the photolithography.

* * * * *